United States Patent [19]

Brown et al.

[11] Patent Number: 4,931,852
[45] Date of Patent: Jun. 5, 1990

[54] HIGH THERMAL CONDUCTIVITY/LOW ALPHA EMISSION MOLDING COMPOUND CONTAINING HIGH PURITY SEMICONDUCTOR FILLER AND INTEGRATED CIRCUIT PACKAGE

[75] Inventors: Candice H. Brown, San Jose; Homi Fatemi, Cupertino, both of Calif.

[73] Assignee: Advanced Micro Devices, Inc., Sunnyvale, Calif.

[21] Appl. No.: 180,421

[22] Filed: Apr. 12, 1988

Related U.S. Application Data

[63] Continuation-in-part of Ser. No. 874,251, Jun. 13, 1986.

[51] Int. Cl.$^5$ .................. H01L 23/28; H01L 23/30
[52] U.S. Cl. ............................. 357/72; 357/81; 357/67
[58] Field of Search .................. 357/72, 67, 73, 2, 81

[56] References Cited

U.S. PATENT DOCUMENTS 4,426,657 1/1984 Abiru et al. ............................ 357/72
4,514,580 4/1985 Bartlett ................................. 357/72

OTHER PUBLICATIONS

Sze—*Physics of Semiconductor Devices*–2nd ed–John Wiley and Sons, pp. 42–43, 1981.
Wolff—*Semiconductors*–Wiley–Interscience–p. 92, 1971.

*Primary Examiner*—Rolf Hille
*Assistant Examiner*—S. V. Clark
*Attorney, Agent, or Firm*—John P. Taylor

[57] ABSTRACT

The invention discloses an improved integrated circuit package having enhanced thermal conductivity comprising a molding or encapsulation resin having a semiconductor filler material. In a preferred embodiment, the semiconductor filler material comprises a high purity doped semiconductor to reduce alpha errors caused by alpha emisison normally caused by the use of fillers containing trace amounts of radioactive impurities and to provide enhanced thermal conductivity.

24 Claims, 1 Drawing Sheet

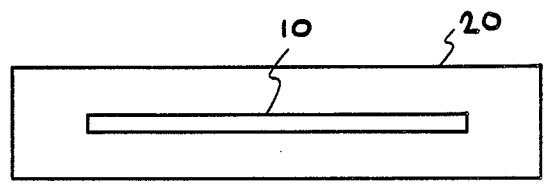

HIGH THERMAL CONDUCTIVITY/LOW ALPHA EMISSION MOLDING COMPOUND CONTAINING HIGH PURITY SEMICONDUCTOR FILLER AND INTEGRATED CIRCUIT PACKAGE

CROSS-REFERENCE TO RELATED APPLICATIONS

This application is a continuation-in-part of Brown et al U.S. Patent Application Ser. No. 874,251, filed June 13, 1986.

BACKGROUND OF THE INVENTION

1. Field of the Invention

This invention relates to a molding compound useful in integrated circuit packaging. More particularly, this invention relates to a molding compound useful in an integrated circuit package having increased thermal conductivity whereby heat generated by the encapsulated die, or chip, may be more efficiently transmitted to the surface of the package for dissipation.

2. Description of the Prior Art

Conventionally integrated circuit dice are encapsulated in a filled plastic, such as a filled epoxy resin. Heat generated by the encapsulated die is dissipated by the use of copper lead frames to conduct the heat to the outside of the package.

However, with increasing densification of circuitry in very large scale integration (VLSI) technology, more than $10^5$ devices may be placed on a single chip. The amount of heat which may be generated, particularly if a sizable amount of these devices are high power requirement bipolar-type devices, necessitates improvements in the heat dissipation capabilities of the integrated circuit package.

Since the die has almost equal contact with the lead frame and the encapsulation material, and heat flowing to the copper lead frame is transferred to the encapsulation material, and the encapsulant aids heat flow from the die paddle to the fingers, it would be desirable to enhance the thermal conductivity of the encapsulation material.

The organic resin used in the encapsulation of integrated circuit devices is usually selected for low moisture permeability and low thermal coefficient of expansion to avoid exposure of the encapsulated chip to moisture or mechanical stress, respectively. The choice of plastic molding materials is thus considerably narrowed. Conventionally, epoxy materials meeting these requirements have been utilized.

Cost of encapsulation materials is also a factor, particularly when encapsulation materials, such as expensive epoxy resins, are used. For this reason, as well as for enhanced thermal conductivity, fillers, such as amorphous silicon oxide (silica glass) and crystalline silicon oxide (quartz) fillers, have been used in amounts of about 68-72 percent-by-weight.

While the use of such additives reduces the cost and enhances the thermal conductivity of the encapsulant without compromising the integrity of the resin from either a strength or permeability standpoint, the thermal conductivity is still unacceptably low, particularly for VLSI densities.

Furthermore, the addition of such filler materials, which are normally naturally occurring silicas extracted from ores, e.g., quartz or the like, results in an undesirable rise in operational faults caused by alpha particle emission from trace impurities of thorium, uranium, or other radioactive materials in such ores. This problem is exacerbated by the high density of devices in VLSI technology.

Abiru et al U.S. Pat. No. 4,426,657 suggests the use of an "alpha-ray"-insulating polyimide film formed from a liquid polyimide or polyamic acid composition. The patentees suggest that the film blocks the intrusion of "alpha-rays" from naturally occurring radioactive materials found in ceramic material constituting the surrounding member, in low melting-point glass used as the sealing member, or in a solder composed of tin and lead. The film is coated on the surface of the semiconductor element to a coating thickness of from about 20 to 100 microns. The patentees state that a filler to be incorporated into the polyimide or polyamic acid solution should be of high purity s that it does not substantially produce an appreciable amount of "alpha-rays". They state that silicon is preferred as a filler because it has, in addition to the intended advantage that it imparts a suitable viscosity to the polyamic acid or polyimide solution, an advantage such that the resulting polyimide film layer exhibits an improved "alpha-ray" insulative property as compared with the polyimide film layers formed from other fillers.

While the use of such an additional coating may impart desired insulation to block intrusion of alpha radiation (alpha particles) therethrough from ceramic or glass encapsulants which contain such radiation sources as naturally occurring radioactive materials, it would be desirable to eliminate the need for such an additional coating by the provision of an encapsulant which is substantially free from such naturally occurring alpha particle radiation sources.

It would, therefore, be desirable to provide an encapsulant packaging material exhibiting little or no alpha emission, having enhanced thermal conductivity to facilitate dissipation of heat from the package, and having acceptable thermal coefficient of expansion (i.e., substantially matching that of the device), yet at an economically acceptable cost.

SUMMARY OF THE INVENTION

We have discovered that semiconductor material, particularly crystalline semiconductor material, in particulate form may be used as a filler material in a conventional encapsulating resin system to provide greatly enhanced thermal conductivity. When high purity semiconductor materials are used, the problem of alpha emission traceable to the filler in the encapsulant is virtually eliminated. Furthermore, the thermal conductivity of the semiconductor filler material may be enhanced by doping.

It is, therefore, an object of the invention to provide an improved integrated circuit packaging system characterized by both enhanced thermal conductivity and low alpha emission by the use of high purity particulate semiconductor material as the filler material in the encapsulant of the package.

It is a further object of the invention to provide an improved integrated circuit package characterized by both enhanced thermal conductivity and low alpha emission by the use of high purity doped crystalline semiconductor material in particulate form as the filler material in the encapsulant of the package.

These and other objects of the invention will be apparent from the following description and accompanying drawing.

BRIEF DESCRIPTION OF THE DRAWING

The sole drawing is a fragmentary vertical cross-sectional view of a die encapsulated with the molding compound of the invention.

DESCRIPTION OF THE PREFERRED EMBODIMENTS

In accordance with the invention, the thermal conductivity of an integrated circuit package is increased by the use of a novel molding compound which includes semiconductor particulate material, preferably doped crystalline semiconductor material, as a filler material. The novel molding material may also be used in the manufacture of sockets or any other application where high thermal conductivity and low thermal expansion is required.

The thermal conductivity for silicon, as listed by the Chemical Rubber Company Handbook, is 0.835 watts/cm° C. The corresponding thermal conductivity for fused silica is about 0.0147 watts/cm° C., i.e., less than 1/50 the thermal conductivity of silicon.

The semiconductor material used as a filler material in accordance with the invention may comprise any one of a number of Group IV and III/V semiconductor materials such as, for example, arsenic, boron, gallium, germanium, phosphorus, silicon, silicon carbide or carbon (diamond).

Silicon, silicon carbide, and carbon (diamond) have the best combination of high thermal conductivity, low thermal expansion, non-toxicity, and low radioactivity for use in molding compounds for integrated circuit packaging. However, both silicon carbide and diamond are extremely hard and therefore abrasive. Molding compounds using them could cause excessive wear on molds. The use of diamond filler would have an additional cost disadvantage.

The semiconductor material useful in the invention should have a purity of at least less than $10^{-2}$ parts of naturally occurring impurities up to a purity of less than $10^{-18}$ parts of naturally occurring impurities. Preferably, the purity will be at least less than $10^{-4}$ parts of naturally occurring impurities and more preferably, from a standpoint of low alpha emission, the purity will be at least less than $10^{-13}$ parts of naturally occurring impurities.

Most preferably, the semiconductor material will be a high purity, e.g., semiconductor grade, material to reduce or substantially eliminate the presence of trace amounts of naturally occurring alpha particle emitting radioactive materials. By the term "high purity" is meant a semiconductor material having at least less than $10^{-15}$ parts up to at least about less than $10^{-18}$ parts of naturally occurring impurities (in contrast to the deliberate addition of preselected dopants).

The semiconductor material is, preferably, a high purity silicon material. Amorphous silicon may be used and its use may be advantageous when it is necessary to grind the semiconductor material to obtain the proper particle size as will be discussed below. Preferably, however, the semiconductor material is a high purity crystalline silicon material. Most preferable, is a high purity single crystal silicon material.

In accordance with a preferred embodiment of the invention, the high purity semiconductor material comprises a crystalline material doped with selected impurities, in amounts ranging from about $1 \times 10^{15}$ up to about $1 \times 10^{20}$ atoms/cm$^3$, preferably from about $1 \times 10^{15}$ up to about $1 \times 10^{19}$ atoms/cm$^3$, to enhance the thermal conductivity of the semiconductor since the changes which occur in the crystal lattice of the semiconductor due to such doping not only enhance the electrical conduction of the semiconductor but the thermal conductivity as well, presumably due to lattice vibration and phonon-electron interaction.

Such dopants, for example, when the semiconductor comprises a Group IV material such as silicon, may comprise any Group IIIA or Group VA dopant. Boron, phosphorus, and arsenic are the preferred dopants when silicon is the filler material.

The maximum doping level of the semiconductor for enhancement of the thermal conductivity may vary with the particular material used. However, the level of doping must not be so high as to result in disruption or deformation of the crystal lattice structure as this would have a negative impact on thermal conductivity as well as introduce undesirable mechanical stresses.

The shape of the semiconductor particle is, preferably, generally spherical, i.e., having generally smooth or rounded surfaces as, for example, the type of generally spheroid particle resulting from an atomization process, as opposed to jagged or rough edges as might be found in particles resulting from at least some types of grinding processes. However, the use of an amorphous semiconductor which will not fracture along preferred planes will permit the use of grinding processes to obtain the desired particulate.

The use of non-spherical semiconductor particles, while in the broad contemplation of the invention, is not preferred because sharp or ragged edges can create stress concentration centers which, when occurring in larger particles, can cause cracks to form in the plastic encapsulating material.

However, if the particular grinding process employed is, for example, followed by some treatment to smooth the edges of the particles, then a very practical and economical source of high purity semiconductor material could be found in the utilization, for example, of defect silicon semiconductor wafers, either before processing, or after processing if any and all other materials (oxides, nitrides, polysilicon, and other metals) were removed prior to grinding. In such uses of defective wafers, the wafer could be appropriately doped to achieve the desired degree of thermal conductivity prior to the grinding operation.

Preferably, the average semiconductor particle size will be at least about 10 microns and, most preferably, at least about 20 microns. The particle size should not, however, exceed about 150 microns and, preferably, not exceed about 100 microns because too large a particle size may interfere with the moldability of the filled encapsulating resin and can result in a phenomena known as "resin bleed" in which the plastic flows over the leads and must be subsequently laboriously trimmed off by hand.

Most preferably, the average particle size will not exceed about 60 microns with the typical average particle size being about 45 microns.

When necessary, the semiconductor particle may be provided with a thin oxide coating thereon to promote bonding or adhesion to the encapsulating resin material. From a standpoint of adhesive or coupling, this oxide coating may be as thin as about 5-50 Angstroms, i.e., the naturally occurring oxide coating on a semiconductor, such as silicon, or, if needed, it may be as much as 1000 Angstroms.

Oxide layers thicker than about 1000 Angstroms should be avoided, however, due to their negative impact on the thermal conductivity of the particle. Preferably, the oxide layer thickness will be between about 50 to 500 Angstroms.

Such an oxide coating may be thermally formed on the surface of the particles by heating them in an oxidizing atmosphere, such as ambient air or a mixture of steam and oxygen, at a temperature of, for example 1000° C. for 90 minutes. Shorter periods of time and lower temperatures may be used depending upon the need for the oxidized coating either to promote adhesion to the molding resin or to provide electrical insulation between adjoining particles.

The provision of an oxide coating is thought to provide a degree of electrical insulation or isolation which may be desirable or even required due to the enhanced electrical conductivity of the semiconductor particle, particularly if semiconductor material has been doped which will further improve the electrical conductivity of the semiconductor filler material.

Thus, while it is within the scope of the invention to use a semiconductor particle having little or no oxide on its surface, if the particular resin system employed will bond directly to the semiconductor, it may be either desirable or necessary to provide sufficient oxide on the surface of the particle for electrical insulation purposes.

Molding material 20 encapsulates integrated circuit die 10 to an average thickness of at least about 20 mils (about 509 microns), preferably at least about 50 mils (about 1272 microns), to protect encapsulated die 10 from moisture, dust, etc., as shown in the Figure. While no specific maximum thickness is required, conventionally the thickness of encapsulant 20 usually does not exceed about 150-300 mils (3817-7634 microns) for economic reasons.

The amount of the semiconductor particulate material used in the resin encapsulation system may vary from about 60-75 percent-by-weight. But, preferably, will range from about 68-72 percent-by-weight. Typically, depending upon the density of the filler material, the volume per cent of the filler will be about 56%. If too much filler is used, the integrity of the resin system may be deleteriously affected, while the use of too little filler will fail to achieve the desired degree of thermal conductivity in the encapsulation resin system.

The particular resin in which the semiconductor material may be used can generally be stated to include any typical prior art resin used in commercial molding or encapsulation compounds, such as, for example Mg25F epoxy molding compound available from the Hysol Division of Dexter Corporation or Nitto HC1-2-8 epoxy molding compound available from Nitto Corp. in Japan, both of which include a silane type coupling agent, such as disiloxane, to promote adhesion between the epoxy resin and the filler material. Other typical resins used in molding compounds which may be used with the semiconductor filler of the invention include thermoplastic resins such as polysulfone and polyphenylene sulfide resins.

Basically, any prior art molding material normally used with prior art fillers, such as silica, may be used because the semiconductor filler material of the invention may be tailored, both in physical size and surface chemistry, to approximate the prior art amorphous or crystalline metal oxide or metalloid oxide materials previously used.

Thus, the principal difference between the molding system of the invention and the prior art is not in the resin-filler bond but in the molecular or atomic bonds within the semiconductor material. For example, when silicon particulate is used as the filler in accordance with the invention, the bonds within the crystal are silicon-silicon and the atoms are disposed in the diamond cubic structure, while the bonds in amorphous or polycrystalline silicon oxide prior art fillers are principally silicon-oxygen bonds.

To further illustrate the invention, a sample of a commercial molding compound was made replacing the silica filler with an equal amount (56 volume percent) of oxide coated silicon. The thermal conductivity of the silicon filled compound of the invention was measured and found to be 426% that of the prior art system.

Thus, the invention provides an improved integrated circuit package having improved thermal conductivity by the use of a single crystal semiconductor material, preferably a single crystal doped semiconductor, as a filler for the encapsulating resin. Furthermore, by using a high purity semiconductor material, such as, for example semiconductor grade single crystal silicon, alpha errors caused by alpha emission from trace radioactive impurities present in the naturally occurring silica fillers can be virtually eliminated.

Having thus described the invention, what is claimed is:

1. An improved integrated circuit package comprising an integrated circuit die encapsulated by a molding compound having a semiconductor filler material therein selected from the class consisting of arsenic, boron, gallium, germanium, phosphorus, and silicon to enhance the thermal conductivity of said molding compound, said molding encapsulant having a thickness ranging from at least about 20 mils (about 509 microns) to about 300 mils (about 7634 microns).

2. The improved integrated circuit package of claim 1 wherein said semiconductor filler material comprises about 68-72 wt.% of said molding compound.

3. An improved integrated circuit package comprising an integrated circuit die encapsulated by a molding compound having a high purity semiconductor filler material therein to reduce alpha errors from alpha particle emitting radioactive impurities in the filler material, said molding encapsulant having a minimum thickness of at least about 50 mils (about 1272 microns).

4. The improved integrated circuit package of claim 3 wherein said high purity semiconductor filler material comprises a high purity crystalline semiconductor.

5. The improved integrated circuit package of claim 4 wherein said high purity crystalline semiconductor filler material further comprises single crystal material.

6. The improved integrated circuit package of claim 5 wherein said high purity single crystal semiconductor filler material consists essentially of high purity single crystal silicon material.

7. The improved integrated circuit package of claim 3 wherein said high purity semiconductor material is doped with from about $1 \times 10^{15}$ to about $1 \times 10^{20}$ atoms/cm$^3$ of a dopant to enhance the thermal conductivity of said semiconductor material.

8. The improved integrated circuit package of claim 7 wherein said high purity semiconductor material consists essentially of crystalline silicon doped with a Group IIIA-VA element selected from the class of boron, phosphorus, and arsenic to enhance the thermal conductivity of said high purity semiconductor material.

9. The improved integrated circuit package of claim 7 wherein said high purity semiconductor material consists essentially of single crystal silicon doped with a Group IIIA-VA element selected from the class of boron, phosphorus, and arsenic t-o enhance the thermal conductivity of said single crystal silicon.

10. The improved integrated circuit package of claim 7 wherein said high purity doped semiconductor filler material comprises particulated material having a particle size range of from about 10 to 150 microns.

11. The improved integrated circuit package of claim 6 wherein said high purity single crystal semiconductor material has a particle size range of from 20 to 100 microns.

12. The improved integrated circuit package of claim 3 wherein said high purity semiconductor filler material has an oxide coating thereon of from about at least about 5 Angstroms thickness up to about 1000 Angstroms thickness to enhance the adhesion of said resin to said filler.

13. The improved integrated circuit package of claim 11 wherein said single crystal semiconductor material has an oxide coating thereon of from 50 to 500 Angstroms to provide an insulating layer over said single crystal semiconductor particles.

14. An improved integrated circuit package having enhanced thermal conductivity and low alpha particle emission comprising an integrated circuit die encapsulated by from at least about 20 mils (about 509 microns) to about 300 mils (about 7634 microns) of an encapsulation resin having from about 68 to about 72 wt.% of 20-100 micron particles of a high purity single crystal doped silicon semiconductor filler material coated with from about 5 to 1000 Angstroms of oxide.

15. The improved integrated circuit package of claim 14 wherein said high purity single crystal doped silicon semiconductor material is doped with from about $1 \times 10^{15}$ to about $1 \times 10^{20}$ atoms/cm$^3$ of a dopant to enhance the thermal conductivity of said semiconductor filler material.

16. The improved integrated circuit package of claim 15 wherein said high purity single crystal doped silicon semiconductor material is doped with a Group IIIA-VA element selected from the class of boron, phosphorus, and arsenic to enhance the thermal conductivity of said filler material.

17. An improved molding compound having enhanced thermal conductivity comprising a molding resin and a high purity doped semiconductor filler material.

18. The improved molding compound of claim 17 wherein said high purity doped semiconductor filler material consists essentially of single crystal silicon semiconductor material having a purity of from at least less than $10^{-15}$ up to less than $10^{-18}$ parts of naturally occurring impurities and doped with from about $1 \times 10^{15}$ to about $1 \times 10^{20}$ atoms/cm$^3$ of a dopant to enhance the thermal conductivity of said semiconductor filler material.

19. The improved molding compound of claim 18 wherein said high purity single crystal doped silicon semiconductor material is doped with a Group IIIA-VA element selected from the class of boron, phosphorus, and arsenic to enhance the thermal conductivity of said filler material.

20. The improved molding compound of claim 18 wherein said high purity doped single crystal silicon filler material has an oxide coating thereon of from 5 Angstroms thickness up to about 1 micron thickness.

21. An improved integrated circuit package comprising an integrated circuit die encapsulated in from at least about 10 mils (about 509 microns) to about 300 mils (about 7634 microns) of an encapsulation resin characterized by enhanced thermal conductivity and low alpha particle emission and having particles of a high purity semiconductor filler material therein selected from the class consisting of arsenic, boron, gallium, germanium, phosphorus, aND silicon; said high purity semiconductor filler material having a purity of from at least less than $10^{-15}$ up to less than $10^{-18}$ parts of naturally occurring impurities therein to provide said enhanced thermal conductivity and low alpha particle emission, and being further coated with from 5 to 100 Angstroms of oxide on the surface thereof to promote bonding of said high purity semiconductor filler particles to the encapsulation resin and to provide electrical insulation between the particles.

22. The integrated circuit package of claim 21 wherein said oxide coating thereon comprises a thermal oxide coating formed by heating said semiconductor particles in an oxidizing atmosphere.

23. An improved integrated circuit package comprising an integrated circuit die encapsulated in from at least about 20 mils (about 509 microns) to about 300 mils (about 7634 microns) of an encapsulation resin characterized by enhanced thermal conductivity and low alpha particle emission and having particles of a high purity silicon filler material therein; said high purity silicon filler material having a purity of from at least less than $10^{-15}$ up to less than $10^{-18}$ parts of naturally occurring impurities therein to provide said low alpha particle emission and further being doped with from about $10^{15}$ to about $10^{20}$ atoms/cm$^3$ of one or more dopants selected from the class consisting of arsenic, boron, and phosphorus to provided said enhanced thermal conductivity.

24. The integrated circuit package of claim 23 wherein each of said silicon particles is coated with from 5 to 1000 Angstroms of oxide on the surface thereof to promote bonding to said high purity silicon filler particles to the encapsulation resin and to provide electrical insulation between the particles.

* * * * *